United States Patent [19]
Gottfried-Gottfried et al.

[11] Patent Number: 5,831,431
[45] Date of Patent: Nov. 3, 1998

[54] MINIATURIZED COIL ARRANGEMENT MADE BY PLANAR TECHNOLOGY, FOR THE DETECTION OF FERROMAGNETIC MATERIALS

[75] Inventors: Ralf Gottfried-Gottfried, Dresden; Heinz Kueck, Duisburg, both of Germany

[73] Assignee: Fraunhofer-Gesellschaft zur Foerderung der angewandten Forschung e.V., Munich, Germany

[21] Appl. No.: 682,788

[22] PCT Filed: Jan. 12, 1995

[86] PCT No.: PCT/DE95/00034

§ 371 Date: Jul. 30, 1996

§ 102(e) Date: Jul. 30, 1996

[87] PCT Pub. No.: WO95/20768

PCT Pub. Date: Aug. 3, 1995

[30] Foreign Application Priority Data

Jan. 31, 1994 [DE] Germany .................... 44 02 785.0
Nov. 29, 1994 [DE] Germany .................... 44 42 441.8

[51] Int. Cl.$^6$ .................... G01R 33/02; G01R 33/12; G01B 7/00; G01V 3/10
[52] U.S. Cl. .............. 324/239; 324/207.14; 324/207.17; 324/207.2; 324/235; 324/243; 336/199; 336/221

[58] Field of Search .................... 324/173, 174, 324/201, 207.12–207.26, 225, 228, 235, 239–243, 262, 249, 209; 235/449, 450; 73/514.39, 862.331–862.333, 862.626; 360/110–113, 123, 125; 336/199, 200, 208, 221

[56] References Cited

U.S. PATENT DOCUMENTS

| | | | |
|---|---|---|---|
| 3,002,384 | 10/1961 | MacDonald et al. | 324/173 X |
| 3,614,618 | 10/1971 | Schrader et al. | 324/201 |
| 3,747,085 | 7/1973 | Bala et al. | 324/239 X |
| 4,021,728 | 5/1977 | Makino et al. | 324/235 X |
| 4,649,755 | 3/1987 | Volz | 324/173 X |
| 4,864,238 | 9/1989 | Seitz | 324/249 X |
| 5,111,138 | 5/1992 | Kramer | 324/174 |

*Primary Examiner*—Gerard R. Strecker
*Attorney, Agent, or Firm*—Karl Hormann

[57] ABSTRACT

A miniturized coil arrangement made by planar technology for the detection of material having a magnetic permeability other than zero, provided with a magnetizable core in a first plane of a substrate, an electrically energizable coil wound around a first section of a core to generate flux therein and at least one other coil in a second plane of the substrate adjacent another section of the coil responsive to disturbance in the flux.

21 Claims, 5 Drawing Sheets

MINIATURIZED COIL ARRANGEMENT MADE BY PLANAR TECHNOLOGY, FOR THE DETECTION OF FERROMAGNETIC MATERIALS

TECHNICAL FIELD

The invention relates to an arrangement for the detection of materials having a magnetic permeability differing from zero, in particular ferromagnetic materials.

Aside from detecting materials having a magnetic permeability other than zero, the arrangement in accordance with the invention may also be used for indirectly measuring various other values. For this purpose, the value to be measured must cause a change in the magnetic permeability in the direct vicinity of the arrangement in accordance with the invention.

This occurs, for instance, during relative movement between a ferromagnetic structure (e.g., a structure or scale with equidistant ferromagnetic indicia) and the arrangement in accordance with the invention. For instance, the translation of a toothed rack or the rotation of a pinion moving relative to an arrangement in accordance with the invention, may be detected in this manner. Position and/or angle may thus be defined in connection with an incremental process.

Another field of application is materials testing. Work pieces may be scanned with one or more arrangements in accordance with the invention. The generated signals are a measure of magnetic characteristics or of the local variation of magnetic characteristics (of predetermined sections in stainless steel, for instance) and may thus serve to evaluate and recognize a workpiece. For the recognition of forward or backward movement of a body, a structure comprising equidistant magnetic indicia applied to the body may, for instance, move by two arrangements in accordance with the invention which are displaced from each other by 90°, whereby the direction of movement of the structure and, hence, of the body may be defined on the basis of the signal position of the two signals.

STATE OF THE ART

A rotational angle measuring sensor provided with a permanent magnet as the flux generating component and a coil with a core as the flux detecting component is known from German patent specification DE 3,133,061. There is no conduction of flux by ferromagnetic materials, air being the medium of propagation. The magnetic flux emanating from the permanent magnet is altered as a function of the angular disposition of a rotatably journaled ferromagnetic component and causes a change in the pulse width of the electrical pulses fed through the measuring coil. It has been possible by this special kind of detection to improve the linearity and to achieve reliable detection of the rotational angle with great accuracy. Furthermore, no special geometric configuration of the permanent magnet is required any longer; it may instead be configured conventionally. The unguided magnetic flux path which in connection with the use of a permanent magnet renders miniaturizing of the rotational angle measuring sensor to the sub-millimeter range impossible, constitutes a disadvantage. Moreover, the uncontrollability of the magnetic flux of a permanent magnet is disadvantageous, for it prevents the application of highly sensitive electrical measuring processes, so that any reduction in the size of the rotational angle measuring sensor is subject to very narrow limits, and optimum signal quality cannot be obtained.

In German patent specification DE 4,238,861 there is described a device for defining the position of an axially movable body. One or more coils serve simultaneously as flux generating and flux detecting components. The body to be detected is provided with a ferromagnetic layer which alters the flux in the measuring coil. Because of this, the inductance of this coil also changes which is evaluated as an impedance change by a (half-) bridge circuit. The objects of the disclosure are a higher response sensitivity and maximum independence from ambient conditions. This is accomplished solely by optimizing the ferromagnetic layer applied to the body to be detected, in that any problem of occurring eddy currents is counteracted especially by increasing the electrical resistance of the ferromagnetic layer. The disadvantages mentioned supra in connection with a non-existing ferromagnetic flux conducting structure are equally valid here. Since it is not possible mechanically to manufacture wire coils smaller than a few millimeters, no improvement of defining positions through a size reduction of the device is excluded can be achieved.

German patent specification DE 4,127,209 discloses a generator for inductively generating a measurement signal which defines the position of two bodies relative to each other. The generator comprises a flux generating coil energized by alternating current, an annular ferromagnetic flux conducting structure, and a measuring arrangement consisting of coils which are permeated by at least a portion of the generated magnetic flux and which generate voltages as a function of the position of two bodies relative to each other. In the preferred embodiment of that disclosure, the flux generating coil and the flux conducting structure are connected to the first body, and the measuring coil arrangement is connected to the second body, the measuring coil arrangement being realized either as a printed circuit or as a (flat) wire coil measuring several millimeters at least. The (induction) voltage signals result from the fact that the surface permeated on the measuring coil arrangement by the generated magnetic flux changes in dependence of the relative position of the two bodies. The change in the magnetic flux is caused by a surface change, rather than by a change of the magnetic permeability, for example, of the second body. The object of DE 4,127,209 is by a suitable combination of the measured induction voltages and by groups of special geometrically arranged surface elements to obtain the resulting measurement signal free of cumulative and multiplicative disturbances (noise) and to improve the linearity of the characteristic curve, particularly at the zero transition (both bodies in the "same position") and at the terminal positions (both bodies at maximum separation). The hybrid construction of the entire arrangement as well as the geometric dimensions (several millimeters at least) of the elements defining the spatial resolution are disadvantageous.

A method of measuring torque without physical contact is known from German patent specification DE 3,031,997, wherein an alternating magnetic field is generated on the surface of a test object and wherein the change in the permeability of the surface of the test object resulting from the generated torque is detected by a magnetic yoke which is movable towards the surface of the test object and which has four pole pieces facing the test surface. The magnetic yoke is a soft magnetic pot core comprising an inner core and four pole pieces. The cross-sectional surface of the inner core and of each of the two opposite pole pieces is M-shaped (see FIG. 1 of DE 3,031,997). The inner core is provided with an excitation coil, and the four pole pieces are provided with detector wire coils connected to a magnetic measuring bridge. What is measured in the final analysis is a shift in the symmetry of the induction voltages in the magnetic bridge.

Ferrite cores of the so-called X-formation (two U-cores displaced 90° relative to each other) may also be used, in which case, since there is no inner core, the detector wire coils on the four pole pieces are at the same time used as excitation coils. The limited selection of available core shapes is a disadvantage; the special manufacture of cores which are not commercially available is too complex. Moreover, the disclosed measuring heads cannot be made very small; DE 3,031,997 mentions measuring head diameters of about 20 mm.

A measuring principle for measuring torque and force in a manner free of physical contact is also known from P. Rombach's article "An Integrated Sensor Head in Silicon, for Contactless Detection of Torque and Force" in Eurosensors VII, Budapest from 26 Sep. 1993 until 29 Sep. 1993, page 351. The basic measuring arrangement consists of a soft magnetic U-core having an excitation coil at one of its legs and a magnetic flux detector at the other. In the spatial area immediately adjacent to the ends of the two legs there is provided a metal tape of magnetostrictive properties. The magnetic permeability of the metal tape is changed by magnetostriction when subjected to force or torque. This change in permeability is detected as a current change by a magneto transistor. The technical realization proposed by the article (see FIG. 2 of the article) is a combination of thin layer technology and additional micro mechanical process steps for fabricating the magnetic U-core and the excitation coil as well as a CMOS-process for manufacturing the magneto transistor. The geometric configuration of the U-core is brought about by etching two adjacent V-grooves into a silicon substrate. The two adjacent flanks of the V-grooves form the legs of the magnetic core. But because of the finite slope of the V-flanks the magnetic core is shaped trapezoidally. The core material consists of nickel and iron and is electrolytically precipitated. The fact that this fabrication process is only suitable for magnetic cores of very simple configurations of magnetic cores is a significant disadvantage.

An arrangement for measuring low flux magnetic fields is known from German Patent specification DE 3,738,455. This arrangement may be fabricated by planar micro technology on a single substrate and comprises a core of ferromagnetic material which generates a magnetic flux possibly closed through an air gap and which is provided with at least two coils whereby one of the coils serves as an excitation coil and another, second coil operates as the output coil of the arrangement. Furthermore an excitation coil is fed by a pulsating electric current which is sufficiently strong temporarily to drive the ferromagnetic core to magnetic saturation.

The temporary operation at saturation is necessary because it is only then that the measuring data about the magnetic field to be measured are present in the even harmonics. More particularly, the amplitude of the second harmonic is almost proportional to the value to be measured of the external low flux magnetic field. The very strong fundamental wave and generally the odd harmonics act as disturbances and represent a kind of offset voltage which may cause tremendous drift problems and thus significantly worsen the exactness of the measurement.

Such arrangements based upon the saturation core probe principle used in this reference are also known as Förster probe or fluxgate sensor. In accordance with the above explanation, these require detection of the amplitude of the second harmonic. This is accomplished, for instance, by separating the second harmonic from the other harmonics and, more particularly, from the strongly interfering fundamental wave, by filters. Also, compensation circuits for suppressing the first harmonic (fundamental wave) are used. In addition, for measuring very weak magnetic fields, it is also necessary to compensate the magnetic field of the earth. To this end, two identical Förster probes are connected to each other in a suitable known manner. By fabricating the known arrangement in planar technology it has been possible to reduce the disturbance ratio of the fundamental wave (first harmonic) relative to the useful second harmonic from about 1000:1 to about 30:1. Furthermore, the ferromagnetic core has to be dimensioned such that even at a minimum excitation energy the temporary saturation is nevertheless ensured. This means, for instance, that losses caused by leakage flows in existing air gaps of the ferromagnetic core need be reduced to a minimum. At the same time, care has to be taken that the magnetic field to be measured is coupled into the measuring sensor and, more particularly, into the ferromagnetic core, without, however, too strong a demagnetization of the core. It is very difficult to satisfy these demands at the same time.

DESCRIPTION OF THE INVENTION

Proceeding upon the state of the art referred to above, it is a task of the invention to use an arrangement comprising flux conducting, flux generating and flux detecting components for the detection of materials having a permeability other than zero in a way achieving a spatial resolution in the sub-millimeter range while at the same time providing high measuring sensitivity or measuring accuracy, at a relatively low investment in terms of equipment. Moreover, the used arrangement is to be fabricated by simple and cost-efficient mass-production techniques.

An arrangement which in accordance with the invention is used for detecting materials having a magnetic permeability other than zero comprises the following three elementary components: flux generating coils for generating a magnetic flux, a flux conducting structure for conducting the generated magnetic flux to the measurement positions and flux detecting components at the measurement positions for detecting at least a portion of the generated magnetic flux. The entire arrangement and, therefore, all of its components are manufactured by planar technology on a single substrate.

Magnetic flux (or a magnetic field) is generated by an electric current in one or more flux generating coils. The generated magnetic flux is fed to the measuring positions of the arrangement which may be spatially removed from the flux generating coils, through the flux conducting structure. One or more flux detecting components are placed at these measuring positions. The appropriately combined signals of the components are a measure of the magnetic permeability in the vicinity of the arrangement in accordance with the invention.

Advantageously, the values of the magnetic flux density as a function of the site in the immediate vicinity of a measuring position are strongly dependent on the magnetic permeability in the vicinity of the arrangement. To this end, the suitable combination of the signals may advantageously be based upon principles of difference and/or addition. An appropriate configuration of the flux detecting components (for instance, the winding direction of planar induction coils), an appropriate connection of several flux detecting components and/or corresponding signal processing may contribute to the realization of those principles.

Together with the surrounding medium permeated by the magnetic flux, the entire arrangement in accordance with the invention, consisting of flux generating coils, a flux conducting structure and flux detecting components, establishes a closed magnetic circuit, to which Kirchhoff's rules may be applied analogously to an electric circuit. The magnetic resistances in the arrangement in accordance with the invention are changed by the approach of an external object having a magnetic permeability other than zero. These changes may be detected in different ways, such as at one position, preferably by one or more flux detecting components or by detecting a symmetry shift in the magnetic circuit. The latter, in particular, requires an appropriately configured flux conducting structure as well as a selection and definition of the measuring positions of the flux detecting components adapted to this structure. Because of the measuring principle realized in the arrangement in accordance with the invention, at least one flux detecting component may be further removed from the position or area of the permeability change. Moreover, it is possible also to utilize at least one of the flux generating coils as a flux detecting component. The flux detecting component is preferably positioned so that either the magnetic flux in the flux conducting structure is detected or that that magnetic (leakage) flux is detected which is leaking from the flux conducting structure into the surrounding medium, or is entering from there, at or near the measuring position.

Induction coils or magnetic field sensors which may be fabricated in planar technology, for instance, magneto resistive sensors, Hall elements or fluxgate sensors, are advantageously used as flux detecting components. In one advantageous arrangement a flux generating coil is energized by an electric current having a time-constant and a time-variable component, of any desired amplitude (including, for instance, pure direct current or pure alternating current) and is provided with a ferromagnetic core. The core is made of highly permeable material and, therefore, aside from conducting it also serves to amplify flux. Preferably, the core of the coil is part of the flux conducting structure the material of which has the following advantageous properties. High permeability makes it possible to generate a high magnetic flux density with a relatively low coil current. For providing detectable signals, this is of particular importance in small arrangements in accordance with the invention, since the current density in the coils of the flux generating coils is very low. Furthermore, a high saturation flux density of the material is suitable for amplifying the signals. The use of soft magnetic materials of narrow hysteresis leads to small efficiency losses. Preferred materials possessing these properties are certain iron-nickel alloys which may be further improved by additions of chromium, manganese, molybdenum and other chemical elements. The geometric arrangement of the flux conducting structure preferably is such that the flux conducting structure is constructed of, or conversely could be separated into, one or more U-shaped ferromagnetic base structures, as is the case, for instance, with comb-shaped flux conducting structure.

For the partial or complete compensation of parasitic influences, additional flux detecting components may be arranged in addition to passive shielding arrangements in such a manner that the components detect the magnetic flux of a flux generating coil independently of the magnetic permeability in the vicinity of the arrangement and utilize these signals to compensate for interferences affecting the flux generating coil and/or a flux conducting structure, such as temperature dependent property changes in the ferromagnetic flux conducting structures, or external magnetic fields. Such reference measurements need not be independent of the (change in) magnetic permeability in the vicinity of the arrangement at all times. It often suffices to ensure such independence by suitably selected modulation or measuring techniques at certain points in time or at certain intervals of time. A detection technique based upon difference principles is in general less sensitive to interference. Moreover, depending upon a particular application and structure of an arrangement in accordance with the invention, compensatory measures are also employed to attain larger linearity ranges.

Aside from a single arrangement in accordance with the invention, it is possible to fabricate a plurality of (mutually independent) arrangements in accordance with the invention on a single substrate, spaced at certain distances and certain angular positions from each other. By precisely adjusting the distances and angles the arrangements in accordance with the invention may be aligned with excellent uniformity in a sequential or matrix array. This is advantageous for a precise and quick magnetic pattern or image recognition.

An essential characteristic of the invention is that the arrangement in accordance with the invention may be fabricated on a planar substrate by the methods of planar technology. Owing to the excellent dimensional stability of micro lithography (absolute structural precision<1 $\mu$um, relative structural preciseness<1%) by which the individual elementary components are structured, it is possible to miniaturize the arrangement in accordance with the invention in ranges below 1 mm, which results in a significantly improved spatial resolution of the measurement. A further advantage derived from the miniaturization is the reduced temperature dependency of the measurement signals and smaller disturbances resulting from mechanical shocks or vibrations. Since the dependency of magnetic fields on their position is $r^{-n}$ (n=1 . . . 2) and since the geometric dimensions and their exactness accordingly exert a strong influence on the measurement signals, it has been possible, because of the high structural precision yielded by the exclusive use of planar technology, to maintain the geometry-based deviations in the measurement signals sufficiently small to avoid adjustment costs, particularly where difference detection circuits are used.

A further advantage derived from the miniaturization and the application of (CMOS-compatible) planar technology, is the possibility of integrating electronic circuitry, for instance, for processing and evaluating measurement signals, on the substrate next to the flux generating, flux conducting and flux detecting components. Aside from a cost-efficient and simplified fabrication, this is advantageous in view of the fact that the space between the flux detecting components and the evaluation electronics may be kept very small, rendering external disturbances less important, so that either the spatial resolution may be further improved or even weaker signals may be detected. The latter is of particular advantage where, because of a high spatial resolution, the flux detecting components are provided with only a few coil windings thus necessitating the detection of weaker measurement signals. The great advantage derived from the utilization of coils for generating the magnetic flux is that, because the magnetic flux generated may be controlled by the coil current, highly sensitive modulation techniques may be employed for the detection even of very weak and/or noisy measurement signals.

BRIEF DESCRIPTION OF THE SEVERAL DRAWINGS

The invention will hereafter be described in detail on the basis of embodiments, with reference to the drawing, in which.

Figure 1:
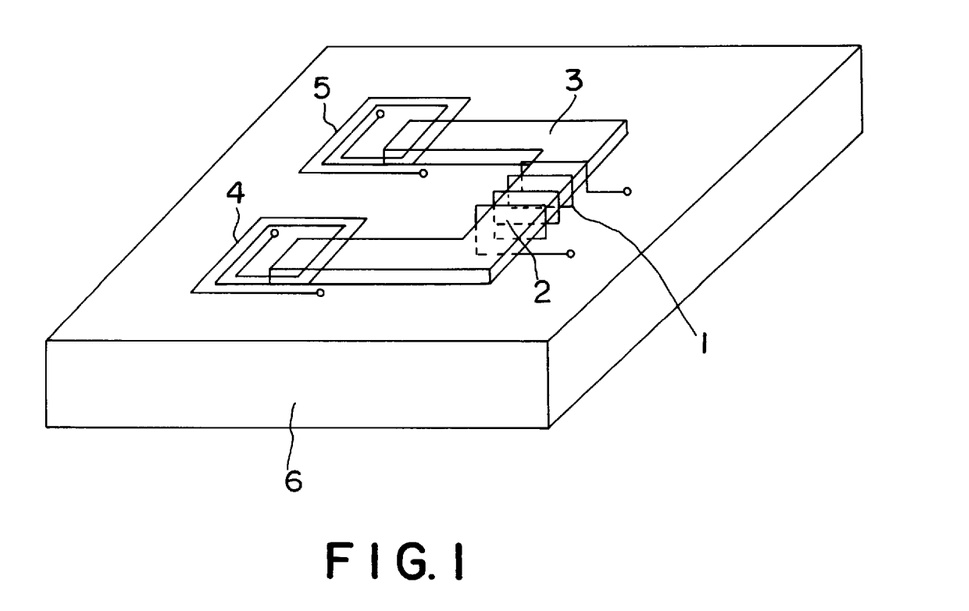
FIG. 1 is a perspective view of an apparatus in accordance with the invention.

A first embodiment is shown in FIG. 1. The flux generating coil (1) consists of a three-dimensional coil including a ferromagnetic (coil) core (2) both fabricated in planar technology. The ferromagnetic core (2) is also part of the flux conducting structure (3) which is U-shaped with the flux generating coil (1) provided at the center portion of the U-shaped flux conducting structure. A flux detecting component (4),(5) is mounted at either end of the flux conducting structure. The flux generating coil (1) including the ferromagnetic core (2), the flux conducting structure (3), and the flux detecting components (4),(5) are all fabricated on a single substrate (6).

Figure 2:
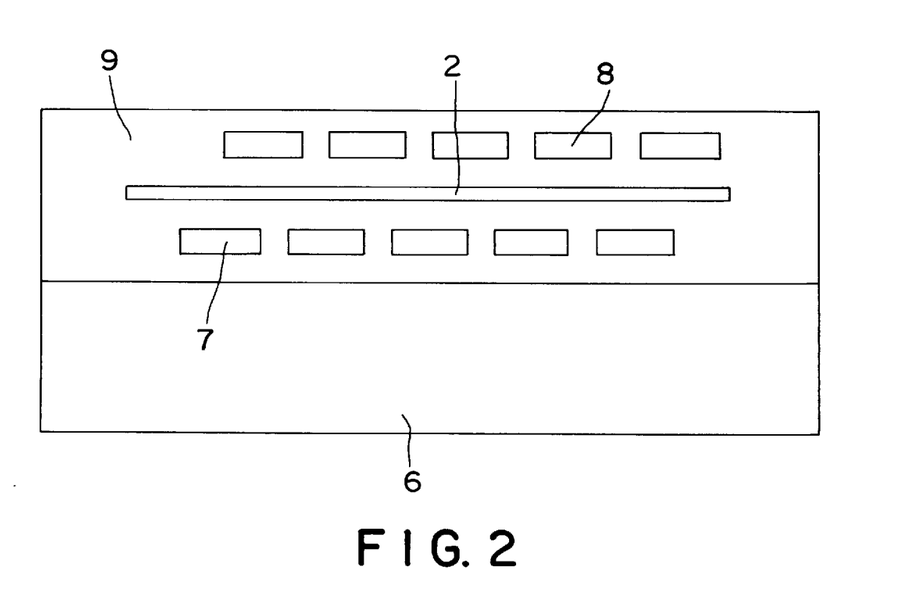
FIG. 2 is a section through a flux generating coil (parallel to its longitudinal axis)
Figure 3:
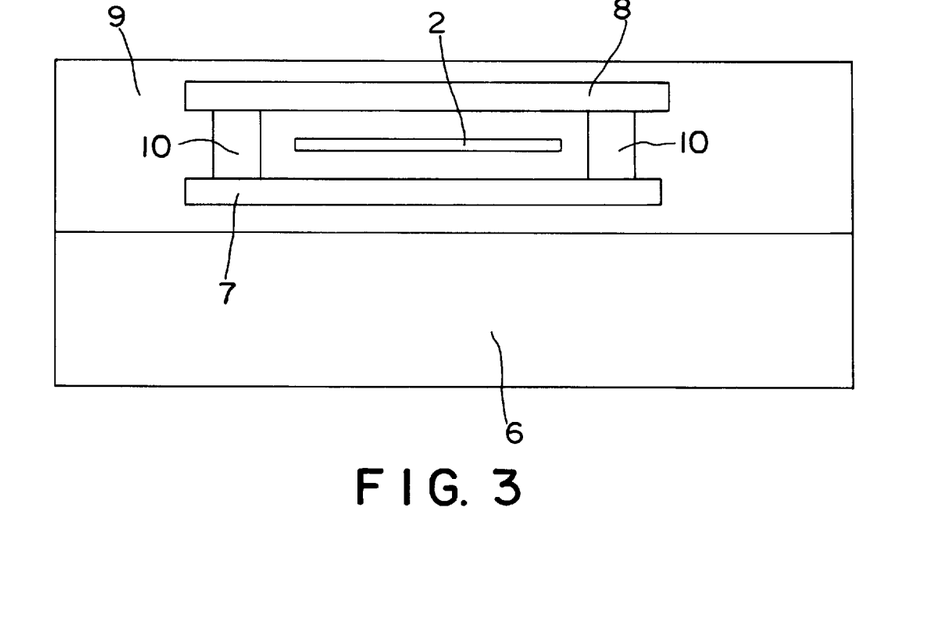
FIG. 3 is a section through a flux generating coil (transversely of its longitudinal axis)

FIG. 2 and FIG. 3 respectively depict a longitudinal and cross-section of the flux generating coil including the flux conducting structure. The fabrication of a flux generating coil is accomplished by patterning a first metallization plane (7) for that part of the coil winding positioned below the flux conducting structure (the ferromagnetic core (2) in particular), and by patterning a second metallization plane (8) for that part of the coil winding which is positioned above the flux conducting structure. The first and the second metallization planes and the flux conducting and flux amplifying ferromagnetic core are electrically insulated from each other by an insulation layer (9). Electrical contact between the first (7) and the second (8) metallization planes exists only in the area of contact holes (10) so as to close the coil windings around the ferromagnetic core (2). The maximum current density in the windings of the flux generating coil is about 1 mA/$\mu$m$^2$.

The two metallization planes consist of a layer of aluminum of a thickness of about 1 $\mu$m; the width of the chosen fifty coil windings is about 3.2 $\mu$m and the spacing between them is about 2 $\mu$m. The insulating layer (9) consists of a layer of silicon dioxide of a thickness of about 1.2 $\mu$m, and the flux conducting structure (3), in this embodiment, is a layer of permalloy about 0.5 $\mu$m thick and about 100 $\mu$m wide, composed of nickel (81%) and iron (19%). This layer may be encapsulated by diffusion barrier layers of tantalum which also serves as a bonding agent. Minimum structural widths of about 5 $\mu$m may be realized for iron-nickel layers; minimum structural widths for other layers are 0.5 $\mu$m; by comparison, the precision of adjustability from structure to structure is about 1 $\mu$m which, at an image surface measuring about 15×15 mm, is better than 0.001.

Figure 1A:
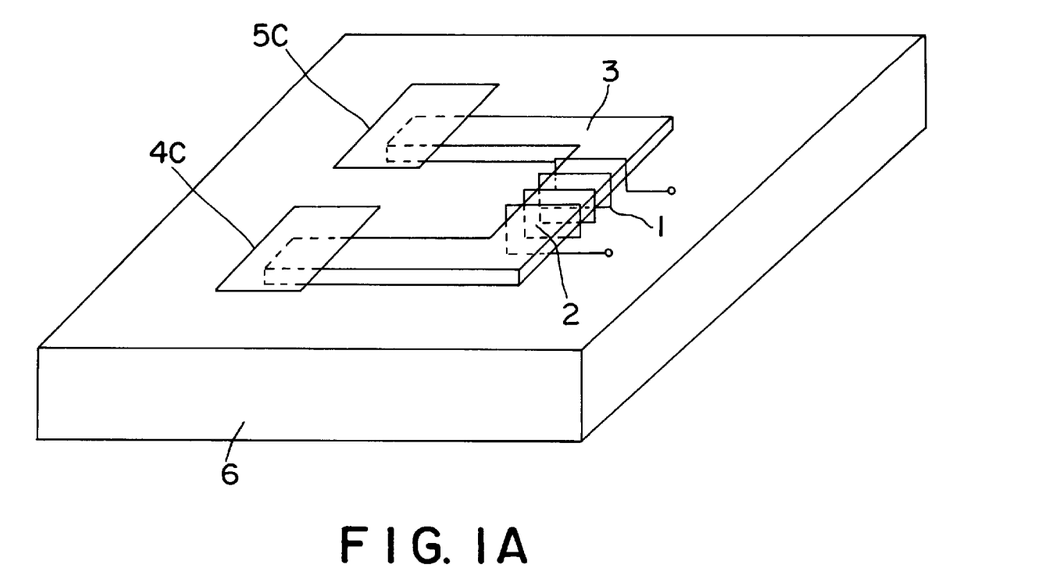
FIG. 1A shows an embodiment of the invention schematically depicting the flux detecting means as Hall sensors, fluxgate sensors or magneto resistive sensors.
Figure 4:
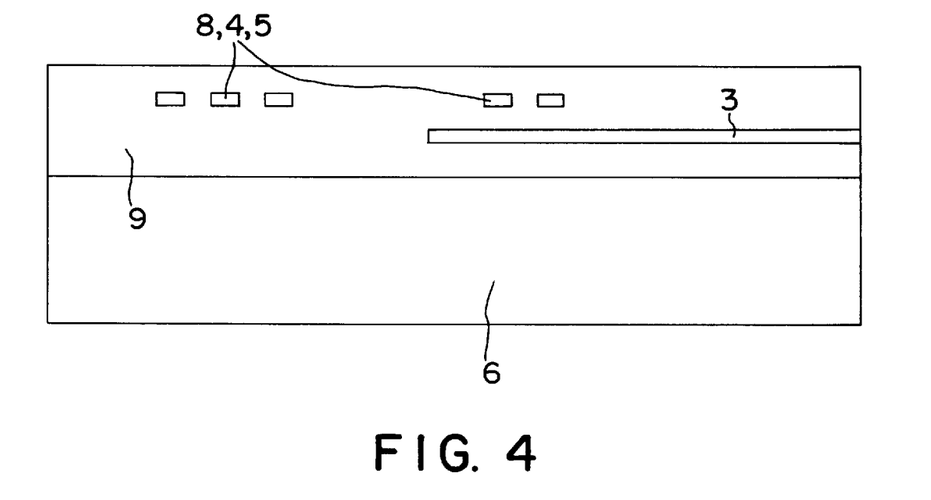
FIG. 4 is a section through a planar coil used as a flux detecting component.

As may be seen in FIG. 1, the flux detecting components (4),(5) are planar coils fabricated by patterning the second metallization plane (8). Another embodiment of the invention is depicted in FIG. 1A in which reference numerals 4c and 5c schematically show the use of Hall sensors, fluxgate sensors or magneto resistive sensors instead of the planar coils 4 and 5 of FIG. 1. FIG. 4 is a cross-section through the longitudinal axis of an arm of the U-shaped structure near one of the two flux detecting planar coils.

Figure 5:
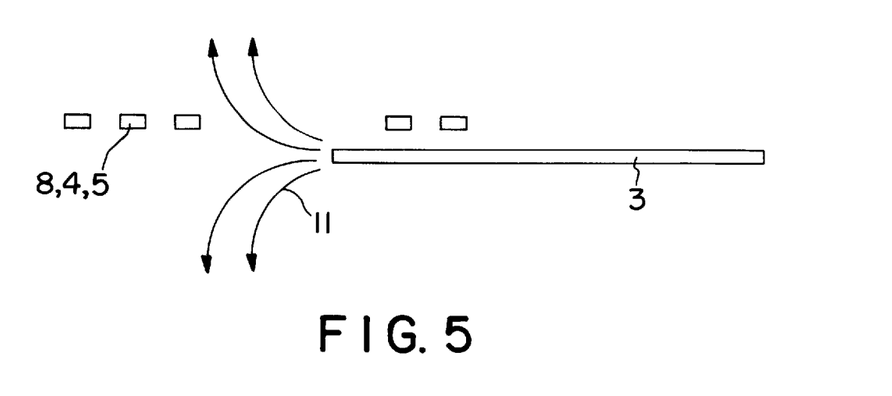
FIG. 5 depicts the function principle without ferromagnetic environment.
Figure 6:
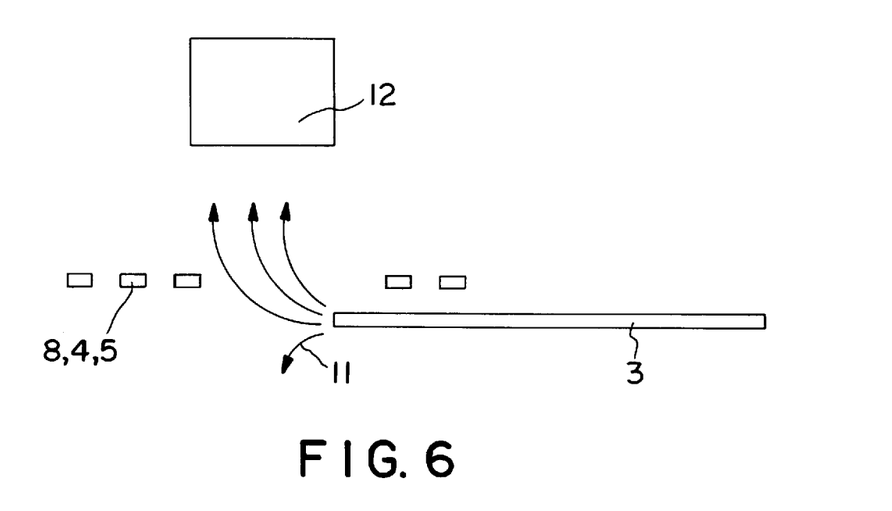
FIG. 6 depicts the function principle with ferromagnetic environment.

In the embodiment, alternating current flows through the flux generating coil (1). Since magnetic field lines are always closed, the generated magnetic flux enters at, and exits from, either end of the U-shaped flux conducting structure. FIG. 5 depicts an arrangement in which no ferromagnetic material is present in the vicinity of the arrangement. At least a portion of the magnetic flux permeates the planar coil (4 or 5) and induces a voltage in the coil. If a ferromagnetic body (12) is moved close to the arrangement (FIG. 6) the magnetic flux permeating the planar coil changes and, therefore, the induction voltage generated is changed which serves as a measuring signal.

Figure 7:
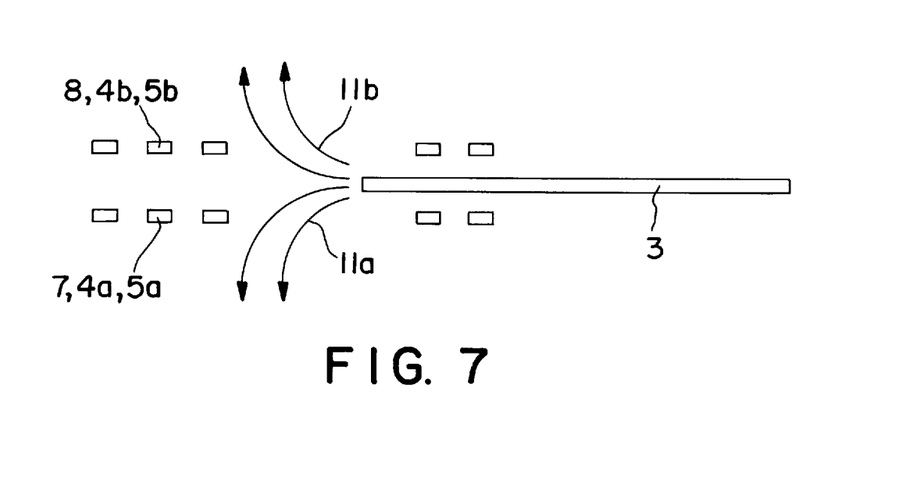
FIG. 7 depicts the function principle with two planar coils without ferromagnetic environment.
Figure 8:
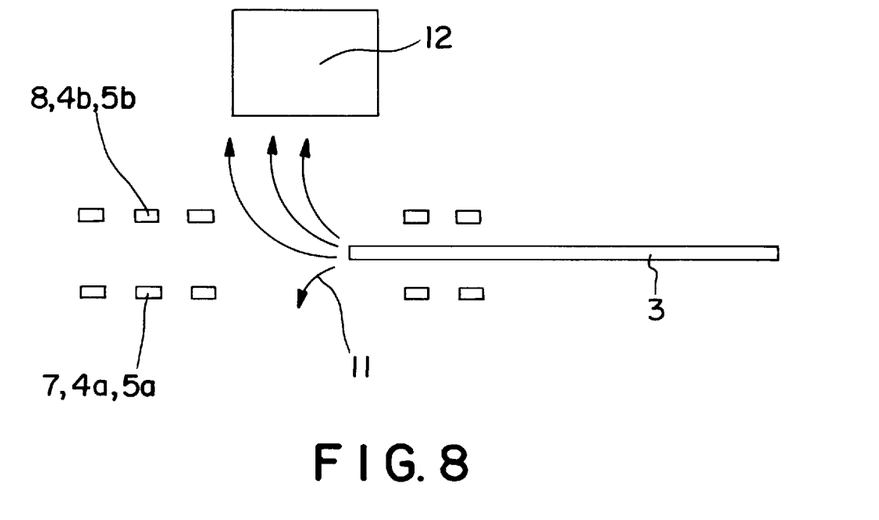
FIG. 8 depicts the function principle with two planar coils and ferromagnetic environment.

In a second embodiment the advantages of difference principles are utilized by way of a suitable circuit arrangement of two planar coils acting as flux detecting components. In FIG. 7 and FIG. 8, two planar coils (4a, 4b or 5a, 5b) are arranged in superposition in the first and in the second metallization plane, respectively. These two planar coils are wound in the same sense of direction and are connected in series so that in the absence of a ferromagnetic body, and provided the planar coils are arranged completely symmetrically, identical magnetic flux (11a, 11b) with opposite signs permeates the two planar superposed coils (FIG. 7). Because of the series connection, the two induced voltages cancel each other out, so that the value of the resulting signal form either coil is zero, and consequently "no signal is measurable". An extraneous ferromagnetic body (12) in the vicinity of the two coils eliminates the symmetry of the magnetic flux (11) at the position of the two coils (FIG. 8) and thus generates an (induction) signal different from zero in the two series connected coils.

Figure 9:
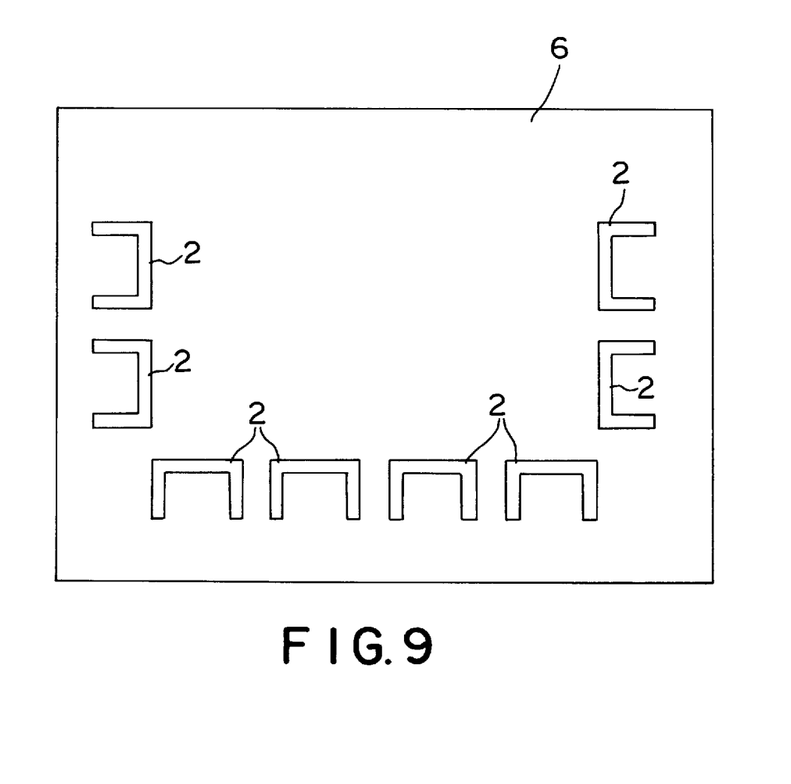
FIG. 9 schematically depicts a plurality of flux generating cores in accordance with the invention arranged in a linear and angular array.

In a further embodiment, a flux generating coil is excited by a time-constant by direct current. The voltages induced in the coils by temporal changes of the magnetic permeability in the vicinity serve as measuring signals. FIG. 9 schematically depicts an arrangement in which a plurality of ferromagnetic detection in accordance with the invention are arranged on a unitary substrate. For the sake of simplicity, only cores 2 configured similarly to the one of FIG. 1 have been shown. Four of the cores are aligned in a linear array, and at both ends of the linear array, disposed normal thereto, two further cores are shown. It will be understood by those skilled in the art that the array shown in FIG. 9 is an exemplary one only and that other layouts may be chosen to suit particular applications.

We claim:

1. An apparatus for detecting material having a magnetic permeability other than zero, comprising:

electrically energizable first coil means for generating magnetic flux;

core means disposed in a first plane for conducting said flux and comprising a section around which said coil is wound and first and second end portions for receiving said flux;

means for detecting flux disposed above said first plane adjacent to at least one of said first and second end portions for generating an electrical signal in response to a disturbance in said flux as a function of said material; and substrate means for securing said first coil means, core means and flux detecting means.

2. The apparatus in accordance with claim 1, wherein at least one of said flux generating coil means, flux conducting core means and flux detecting means geometrically extends along a predetermined dimension in the sub-millimeter range.

3. The apparatus in accordance with claim 2, wherein said means for detecting flux comprises one coil means disposed above said first plane adjacent to each of said first and second end portions.

4. The apparatus in accordance with claim 1, wherein said flux conducting core means is disposed to emit magnetic flux into ambient medium adjacent to at least one measuring position. detecting means.

5. The apparatus in accordance with claim 4, wherein said flux conducting core means comprises at least one member of substantially U-shaped configuration.

6. The apparatus in accordance with claim 4, wherein said measurement position is outside of said substrate means adjacent to said flux delecting means.

7. The apparatus in accordance with claim 1, wherein said flux conducting core means contains at least one ferromagnetic material.

8. The apparatus in accordance with claim 7, wherein said ferromagnetic material comprises an iron-nickel alloy.

9. The apparatus in accordance with claim 1, wherein said flux generating coil means comprises a three-dimensional coil surrounding said section of said flux conducting core means.

10. The apparatus in accordance with claim 9, wherein said flux generating three dimensional coil means comprises patterning on a first and on a second metallization plane and electrically conductive contact connections between said first and second metallization planes.

11. The apparatus in accordance with claim 10, wherein said flux conducting core (2) means is provided intermediate said first and second metallization planes and wherein insulating layers are provided for electrically insulating said flux conducting core means from said first and second (8) metallization planes.

12. The apparatus in accordance with claim 11, wherein each said insulating layer comprises at least one of silicon nitride and silicon dioxide and wherein each of said first and second metallization planes comprises aluminum.

13. The apparatus in accordance with claim 1, wherein said means for detecting flux comprises one of induction coil means, magneto resistive sensor means, Hall element means and fluxgate sensor means.

14. The apparatus in accordance with claim 13, wherein said induction coil means comprises a planar induction coil patterned on only one metallization plane.

15. The apparatus of claim 14, wherein said induction coil means is positioned above at least one of said first and second end portions.

16. The apparatus in accordance with claim 14, wherein at one measuring position there are provided as flux detecting means two symmetrically structured planar induction coils wound in the same directional sense and connected in series whereby at one of a zero magnetic permeability in the vicinity of the apparatus and symmetrical distribution of the permeability in the vicinity of the apparatus said two induction coils provide a zero value.

17. The apparatus in accordance with claim 16, wherein said two planar induction coils are arranged in spatial superposition in said first and said second metallization planes.

18. The apparatus in accordance with claim 15, wherein at least one additional flux detecting means is provided for detecting magnetic flux at the other said first and second end portions.

19. The apparatus in accordance with claim 1, wherein a plurality of said flux generating coil means, flux conducting core means and flux detecting means are fabricated in said substrate means at predetermined distances from and predetermined angular positions relative to each other.

20. The apparatus in accordance with claim 19, wherein said plurality of said flux generating coil means, flux conducting core means and flux detecting means are aligned in a linear array.

21. The apparatus in accordance with claim 19, wherein said plurality of said flux generating coil means, flux conducting core means and flux detecting means are aligned in a matrix array.

* * * * *